United States Patent
Kim et al.

(10) Patent No.: US 7,782,693 B2
(45) Date of Patent: Aug. 24, 2010

(54) SEMICONDUCTOR MEMORY DEVICE AND OPERATION CONTROL METHOD THEREOF

(75) Inventors: Byoung-Sul Kim, Suwon-si (KR); Joon-Hee Lee, Yongin-si (KR); Jae-in Song, Hwaseong-si (KR); Jun-Ho Jo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 196 days.

(21) Appl. No.: 12/007,518

(22) Filed: Jan. 11, 2008

(65) Prior Publication Data

US 2008/0175081 A1    Jul. 24, 2008

(30) Foreign Application Priority Data

Jan. 23, 2007    (KR) ...................... 10-2007-0006818

(51) Int. Cl.
*G11C 7/00*    (2006.01)

(52) U.S. Cl. ...................................... 365/203; 365/222

(58) Field of Classification Search ................. 365/203, 365/222
See application file for complete search history.

(56) References Cited

U.S. PATENT DOCUMENTS

| 6,643,212 B1 | 11/2003 | Jones, Jr. et al. |
| 6,894,946 B2* | 5/2005 | Jang ......................... 365/233.1 |
| 6,909,658 B2* | 6/2005 | Arimoto et al. ............. 365/222 |
| 2003/0161207 A1 | 8/2003 | Jones, Jr. et al. |
| 2003/0235107 A1* | 12/2003 | Jang ........................... 365/233 |
| 2005/0141293 A1 | 6/2005 | Ha |

* cited by examiner

*Primary Examiner*—Michael T Tran
(74) *Attorney, Agent, or Firm*—Harness, Dickey & Pierce, P.L.C.

(57) ABSTRACT

A semiconductor memory device and an operation control method thereof are provided. The method may comprise executing a control such that a precharge operating mode and an active operating mode may be successively performed in response to one pre-active command, thereby reducing the current consumption and loading of the system, and thus, enhancing system performance.

15 Claims, 7 Drawing Sheets

SEMICONDUCTOR MEMORY DEVICE AND OPERATION CONTROL METHOD THEREOF

PRIORITY STATEMENT

This application claims priority under 35 U.S.C. §119 to Korean Patent Application No. 2007-0006818, filed on Jan. 23, 2007, in the Korean Intellectual Property Office (KIPO), the entire contents of which are herein incorporated by reference.

BACKGROUND

1. Field

Example embodiments relate to a semiconductor memory device that is capable of automatically performing a precharge operation and an active operation through one command, and an operation control method thereof.

2. Description of Related Art

Semiconductor memory devices, for example, DRAMs, generally have a structure that allows for performing an operation in response to a command, an address signal, or data applied from an external chip-set. This is described in reference to FIG. 1.

Referring to FIG. 1, a semiconductor memory device 100 performs an active mode operation, a read or write mode operation, or a precharge mode operation in response to a command CMD, data applied through data input/output line (or pad) DQ or DQS, or an address signal ADD applied through an address line from an external chip set 200.

In the active operating mode, which allows for responding to active command CMD applied from the chip set 200, the operation of enabling a word line to select a memory cell is performed. The read or write operating mode allows for writing to or for reading storage data from a memory cell in response to read or write command CMD applied from the chip set 200. The precharge operating mode allows for precharging the bit line level connected to the memory cell to a given level in response to a precharge command CMD applied from the chip set 200.

FIG. 2 illustrates timing of a semiconductor memory device according to the conventional art.

Referring to FIG. 2, an active command ACT is applied from the chip set 200. At the same time as the input of active command ACT, a bank address BA and a first row address signal RA1 are applied from the chip set 200. The semiconductor memory device 100 then performs an active mode operation. A word line corresponding to the first row address RA1 of the bank corresponding to the bank address BA is enabled. As the read or write command W/R, bank address BA, and column address CA are applied, read or write mode operation is implemented. In the read operation, data stored in a corresponding memory cell of the memory device 100 is output to the chip set 200 through the data input/output line (or pad) DQ. In the write operation, data provided from the chip set 200 is written to a corresponding memory cell of the semiconductor memory device 100. The corresponding memory cell indicates a memory cell selected by the bank address BA, the first row address RA1, and the column address CA.

The precharge command PRE from the chip, together with the bank address BA, is applied to the semiconductor memory device 100. The semiconductor memory device performs a precharge of the corresponding bank in response to the precharge command PRE. Subsequently, the next active command ACT is applied from the chip set 200, and simultaneously, bank address BA and the second row address signal RA2 are applied, and a subsequent active operation of the area corresponding to an address is performed.

The chip set 200 applies data, command, and address signals to the semiconductor memory device 100 on the basis of a predetermined specification. For example, it may be defined that the minimum time to perform a read/write operation by a corresponding bank after the active mode is tRCD (ACT TO/CAS DELAY), and that the precharge time guaranteed until the active command ACT for the next active operation is applied after the generation of precharge command PRE is tRP (PRE TO ACT DELAY). Time from the input of active command ACT and the next execution of the sensing operation to a restored bit line operation (e.g., the active time until the precharge command PRE is applied after generation of the active command ACT), may also be determined as tRAS (ROW ACTIVE TIME). A summed time of the precharge time and the active time may be defined as tRC (ROW CYCLE TIME).

In a semiconductor memory device, it may be difficult to simultaneously perform operations at different areas (e.g., different memory banks) at the same clock cycle. For example, while a first memory bank performs a precharge operation, it is almost impossible to perform an active operation at a second memory bank at the same time. Because of this, the chip set has a structure in which more than two commands are not available for generation at the same clock cycle. In other words, the structure of the chip set allows for only one command to be applied at a clock cycle. This is described as follows with reference to FIG. 3.

FIG. 3 illustrates timing for a bank interleave operation in a conventional semiconductor memory device.

As shown in FIG. 3, active commands ACTA, ACTB, ACTC, and ACTD for four banks A, B, C, and D, respectively, are sequentially applied. The semiconductor memory device then starts to perform an active operation for the respective banks. After a lapse of active time tRAS, precharge commands PREA, PREB, PREC, and PRED for banks A, B, C, and D, respectively, are applied. The semiconductor memory device then performs a precharge operation for each bank. When the precharge command PREC for bank C is applied, bank A has already satisfied the precharge time tRP and thus, the next active operation is available. The next active command ACTA for bank A may be applied, but the next active command ACTA for bank A cannot be applied as a precharge command PREC for bank C. In other words, the next active command ACTA for bank A must be applied after the precharge command PRED for bank D. Thus, the active operation and the precharge operation for different banks cannot be performed at the same time. This also creates a shortcoming of not being able to guarantee a minimum condition of tRC (ROW CYCLE TIME) (e.g., lengthening tRC (ROW CYCLE TIME)).

SUMMARY

Example embodiments provide a semiconductor memory device and an operation control method thereof that may be capable of reducing the number of commands applied from a chip set and thus, may reduce the loading based on the command. A precharge or an active operation for different memory areas may be performed at the same clock cycle. Performance of the system may be improved and current consumption may be reduced.

According to example embodiments, a method of controlling operation of a semiconductor memory device may comprise executing a control such that a precharge operating mode and an active operating mode may be successively performed in response to one pre-active command.

The active operating mode may automatically begin after the start of the precharge operating mode and after a given delay. Simultaneously to the pre-active signal, a bank address signal for the precharge operating mode and the active operating mode and a row address signal for the active operating mode may be applied together.

The bank address signal and the row address signal may be latched until the active operating mode starts, and the pre-active command may be selected by an extended mode register set (EMRS). The level of delay from the start of the precharge operating mode to the start of the active operating mode may be controlled.

In the semiconductor memory device, a precharge operation and an active operation may be performed by the pre-active command in a specific mode, and the precharge operation and the active operation may be performed by a specific precharge command and a specific active command in a normal mode.

According to example embodiments, a semiconductor memory device may comprise an operation controller for performing, internally and automatically, a precharge operation and an active operation successively with a constant delay interval, in response to one pre-active command applied from an external chip set. The semiconductor memory device may also comprise an address controller for controlling address signals provided from the external chip set such that the precharge operation and the active operation of the operation controller are obtained.

Each address signal may contain a bank address signal and a row address signal. The address signals may be applied simultaneously to the pre-active command. The address controller may comprise an address latch for latching the bank address signal and the row address signal until the active operation starts. The operation controller may comprise a delay control unit for controlling the level of delay from the start of the precharge operation to the start of the active operation. The pre-active command may be selected by an EMRS.

In the configuration of example embodiments described above, current consumption may be reduced, system performance may be improved, and loading of the system may be reduced.

BRIEF DESCRIPTION OF THE DRAWINGS

Example embodiments will be more clearly understood from the following detailed description taken in conjunction with the accompanying drawings.

FIG. 1 illustrates the structure of a semiconductor memory device and a chip set according to the conventional art;

FIG. 2 illustrates timing of a semiconductor memory device according to the conventional art;

FIG. 3 illustrates timing for a bank interleave operation in a conventional semiconductor memory device;

FIG. 4 is a block diagram of a semiconductor memory device according to example embodiments;

FIG. 5 is a circuit diagram illustrating an address latch adapted in an address controller of the semiconductor memory device illustrated in FIG. 4;

FIG. 6 illustrates timing of the semiconductor memory device illustrated in FIG. 4; and FIG. 7 illustrates timing for a bank interleave operation in the semiconductor memory device illustrated in FIG. 4.

DETAILED DESCRIPTION OF EXAMPLE EMBODIMENTS

Figure 1:
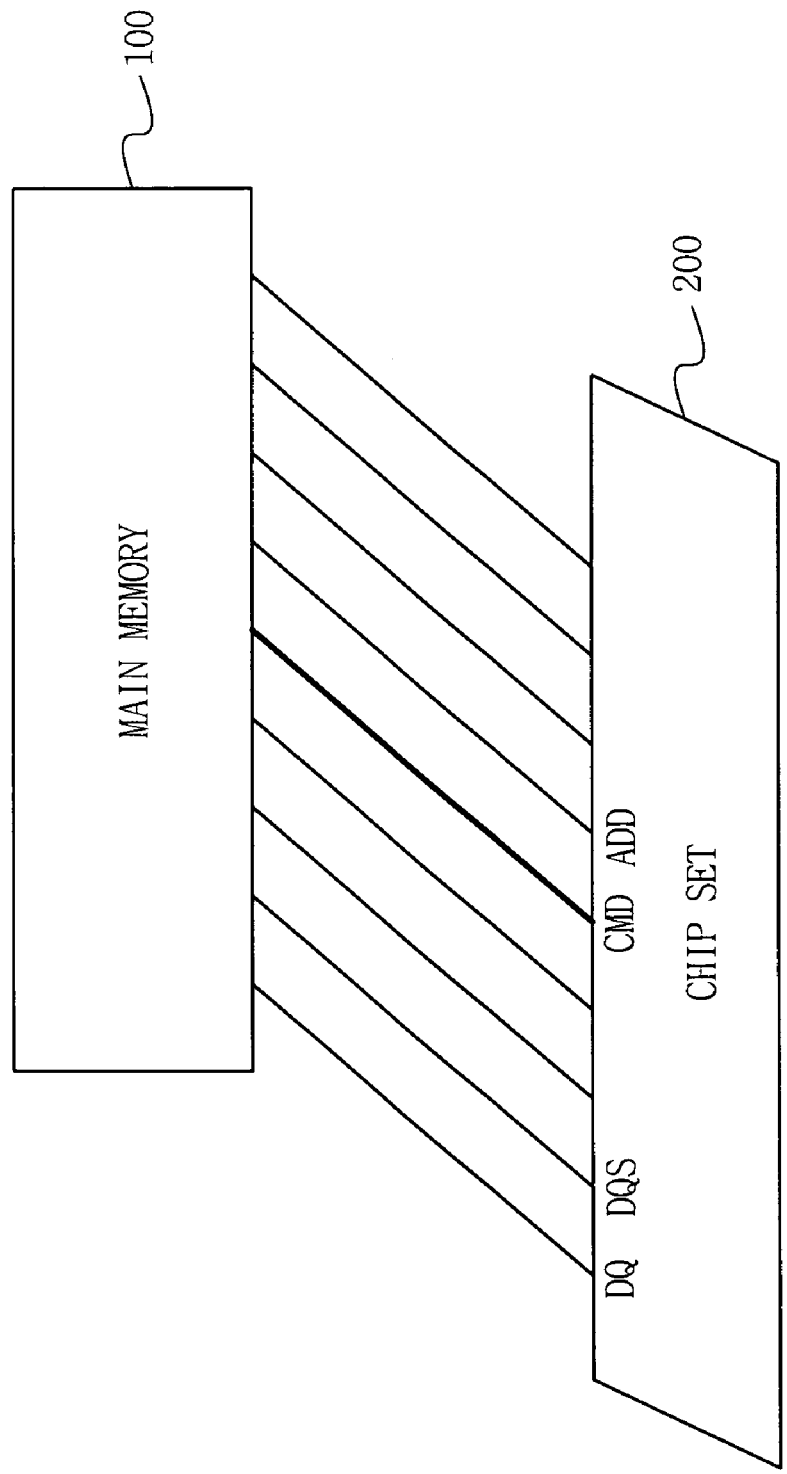
FIGS. 1-7 represent non-limiting, example embodiments as described herein.
Figure 2:
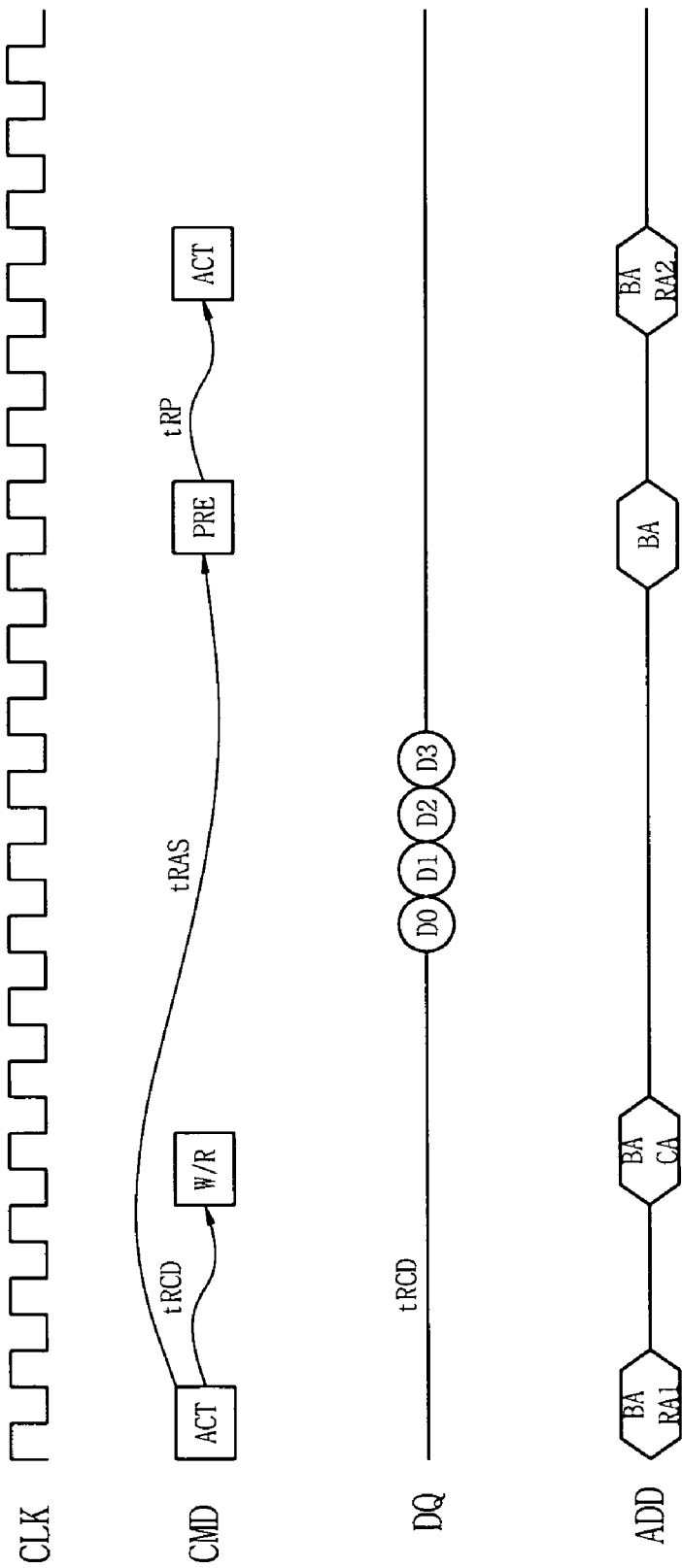

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
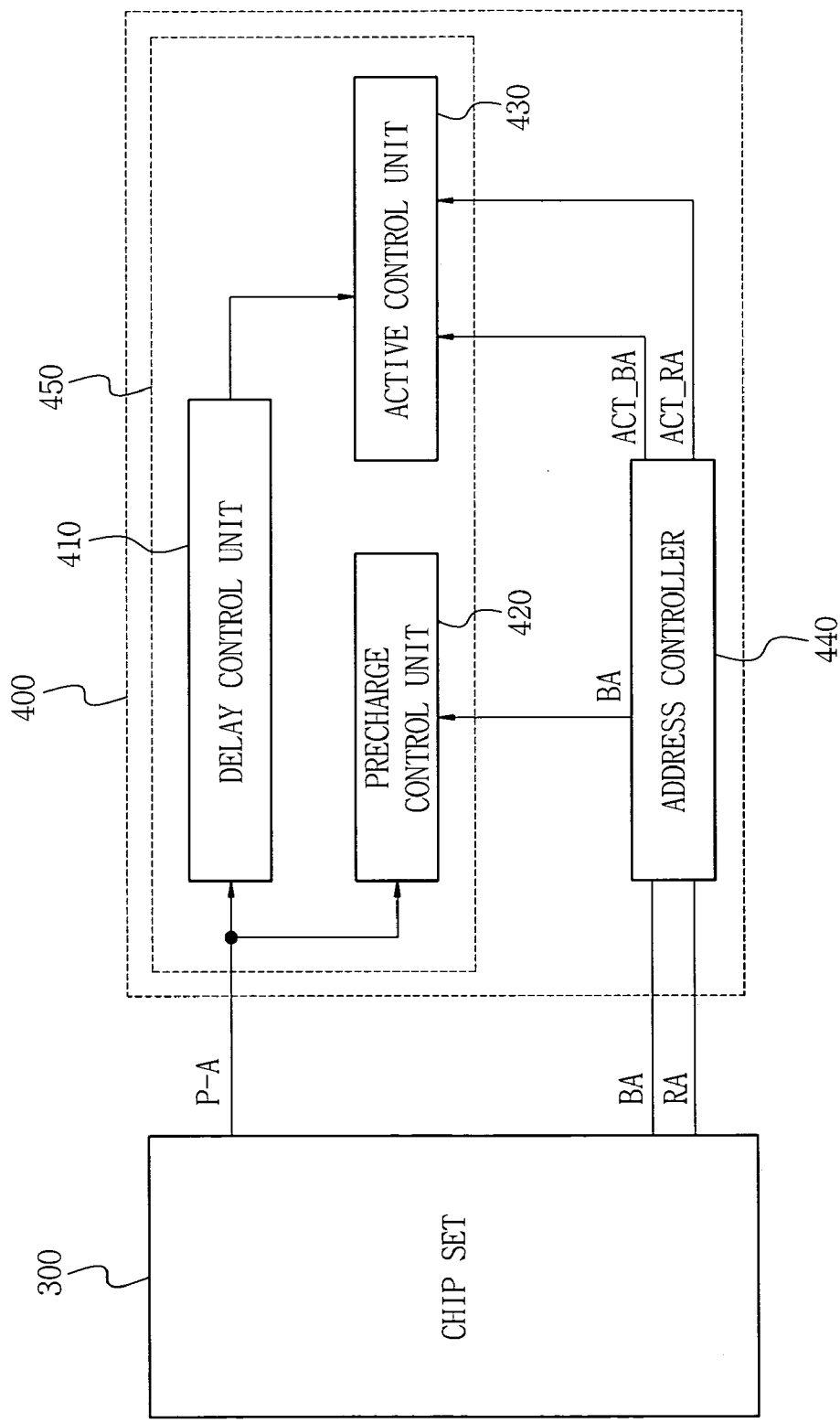

FIG. 4 is a block diagram illustrating a semiconductor memory device 400 according to example embodiments.

Referring to FIG. 4, the semiconductor memory device 400 may comprise an operation controller 450 and an address controller 440.

In the operation controller 450, a precharge operation and an active operation may be automatically performed successively with a given delay interval and internally in response to one pre-active command P-A applied from an external chip set 300. The operation controller 450 may include a delay control unit 410, a precharge control unit 420, and an active control unit 430. In comparison with a conventional semiconductor memory device in which an active command ACT and a precharge command PRE are separately applied, the command system scheme of example embodiments may be more simple and there may be a smaller number of commands, thereby reducing the loading of the chip set 300.

The pre-active command P-A may have the same signal structure as the conventional active command ACT or precharge command PRE, or may have a signal structure different therefrom. For example, assuming that in the specification of a conventional active command ACT, a chip enable signal CS is determined to be at a low level, a RAS to be at a high level, and a write enable signal WE to be at a high level, and that in the specification of a precharge command PRE, a chip enable signal CS is determined to be at a low level, a RAS to be at a low level, a CAS to be at a high level, and a write enable signal WE to be at a low level, the pre-active command P-A may have the same signal structure as a conventional active command ACT or precharge command PRE, or may have some other signal structure.

The delay control unit 410 may delay the pre-active command P-A for a given time and apply it to the active control unit 430. This delay may be a delay corresponding to the precharge time tRP well-known to those skilled in the art. It may be determined herein that the pre-active command P-A may be applied at an applied time point of precharge command PRE in normal mode such that time of the normal mode and active operation are made equal.

In addition, the delay control unit 410 may comprise a control unit (e.g., a fuse, and etc.) to control the level of the delay. For example, a plurality of delay circuits each having a fuse may be adapted to control an operation of the delay circuit through a fuse cut and thus, control the level of the delay.

The precharge control unit 420 may perform a precharge operation in response to the pre-active command P-A. The precharge operation may be the same as the operation executed when the precharge command PRE of a conventional semiconductor memory device is applied, except a characteristic command may be applied. The precharge control unit 420 may include all of the control circuits relating to the precharge operation of a general semiconductor memory device.

The active control unit 430 may perform an active operation in response to a command signal that may have been delayed for a given time before being applied by the delay control unit 410. The active operation may be the same as the operation executed when the active command ACT of a conventional semiconductor memory device is applied, except a characteristic command may be applied. The active control unit 430 may include all of the control circuits relating to the active operation of a general semiconductor memory device.

The semiconductor memory device 400 may further comprise a command generator (not shown) for generating, in the generation itself, the precharge command PRE and active command ACT that may be generated after a given delay thereafter, in response to the pre-active command P-A. The active command ACT generated in the command generator may be applied to the active control unit 430, and the precharge command PRE may be applied to the precharge control unit 420.

The address controller 440 may control address signals BA and RA provided from the external chip set 300 such that precharge operation and active operation of the operation controller 450 are obtained.

The address signals BA and RA may include a bank address signal BA and a row address signal RA. The address signals BA and RA may be applied simultaneously to the applied pre-active command P-A. It is noted for reference that the conventional art may have an operation structure such that when active command ACT is applied, bank address BA and row address RA may be applied at the same time, and when precharge command PRE is applied, only bank address BA may be applied simultaneously.

The address controller 440 may transmit intact the bank address signal BA applied from the chip set 300 to obtain operation of the precharge control unit 420 and may provide support so that precharge operation of a corresponding bank may be performed. It may be configured herein to latch and transmit the bank address BA to the precharge control unit 420.

The bank address BA and the row address signal RA may be latched to obtain operation of the active control unit 430. In the conventional art, latching the addresses BA and RA is not needed because bank address BA and row address RA may be applied at the same time as the active command. However, the active operation may be performed automatically without a specific active command, and thus, latching the bank address BA and the row address RA applied when the pre-active command P-A is applied may be needed until the active operation starts. Active address signals ACR_BA and ACT_RA applied to the active control unit 430 may be address signals that address signals BA and RA applied from the chip set 300 was latched. It may be controlled herein such that a latched address signal is output after a given delay.

The pre-active command P-A may be selected by an EMRS (Extended Mode Register Set). The EMRS may determine additional operating modes, except for general operating modes of a memory device (e.g., CAS latency (Column Address Strobe latency), burst length, and etc.), and may determine the driver strength, the TCSR (Temperature Compensated Self Refresh), and the PASR (Partial Array Self Refresh). The pre-active command P-A may be determined and controlled by the EMRS.

The semiconductor memory device may be classified herein in regards to a specific mode and a normal mode. As described above, in the specific mode, precharge and active operations may be performed through the pre-active command P-A, and in the normal mode, active operation and precharge operations may be performed in response to the specific active command ACT and precharge command PRE.

Figure 5:
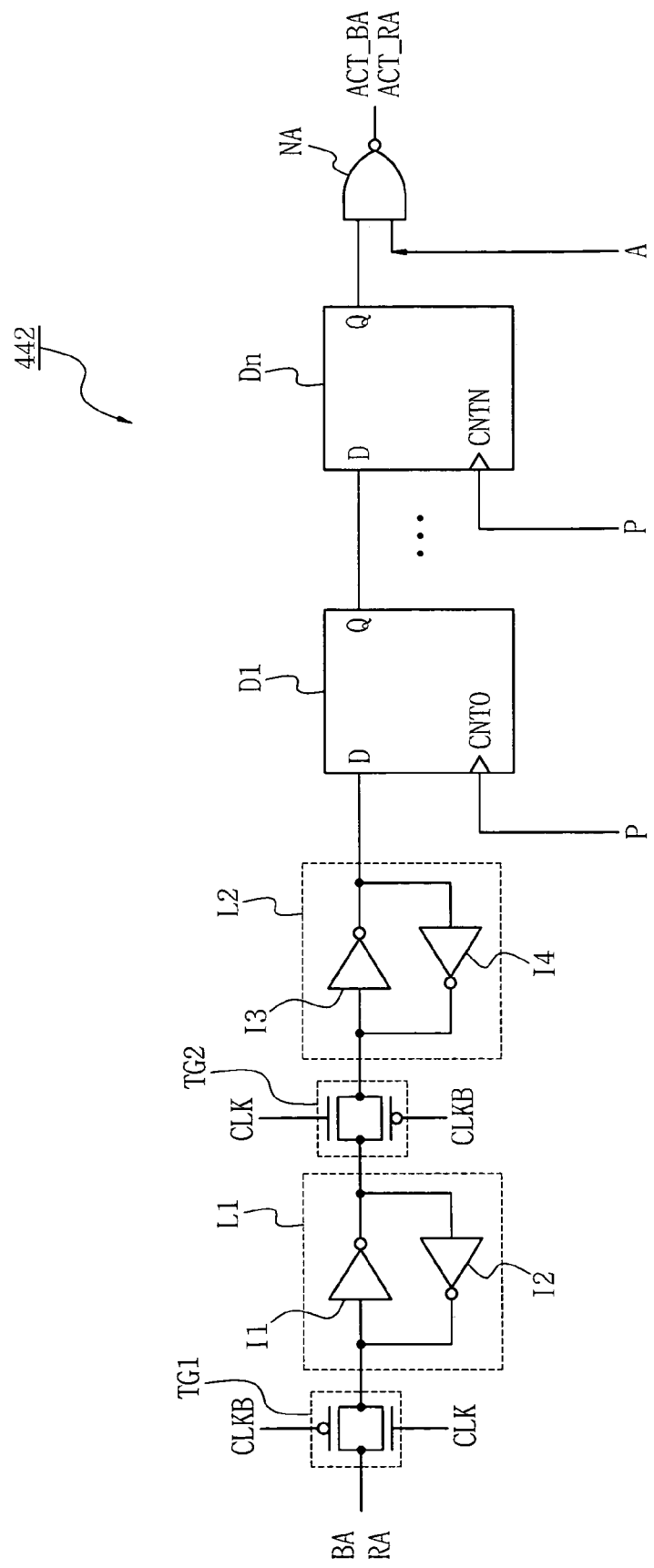

FIG. 5 illustrates an example of an address latch adapted in the address controller 440 of the semiconductor memory device illustrated in FIG. 4.

The address latch 442 may include transfer gates TG1 and TG2, latch circuits L1 and L2 configured with inverters I1, I2, I3, and I4, delay circuits D1 to Dn, and a NAND circuit NA. The wiring structure of the address latch 442 is illustrated in FIG. 5.

FIG. 5 illustrates a case where the address latch 442 latches the address signal to be applied to the active control unit 430. The address signal BA applied to the precharge control unit 420 may be applied from the chip set 300 or from any one of the outputs from the latch circuits L1 and L2.

A first signal P as an input signal of the delay circuits D1~Dn may be an operating signal of the precharge control unit 420, and a second signal A input to the NAND circuit NA may be an operating signal of the active control unit 430.

Figure 6:
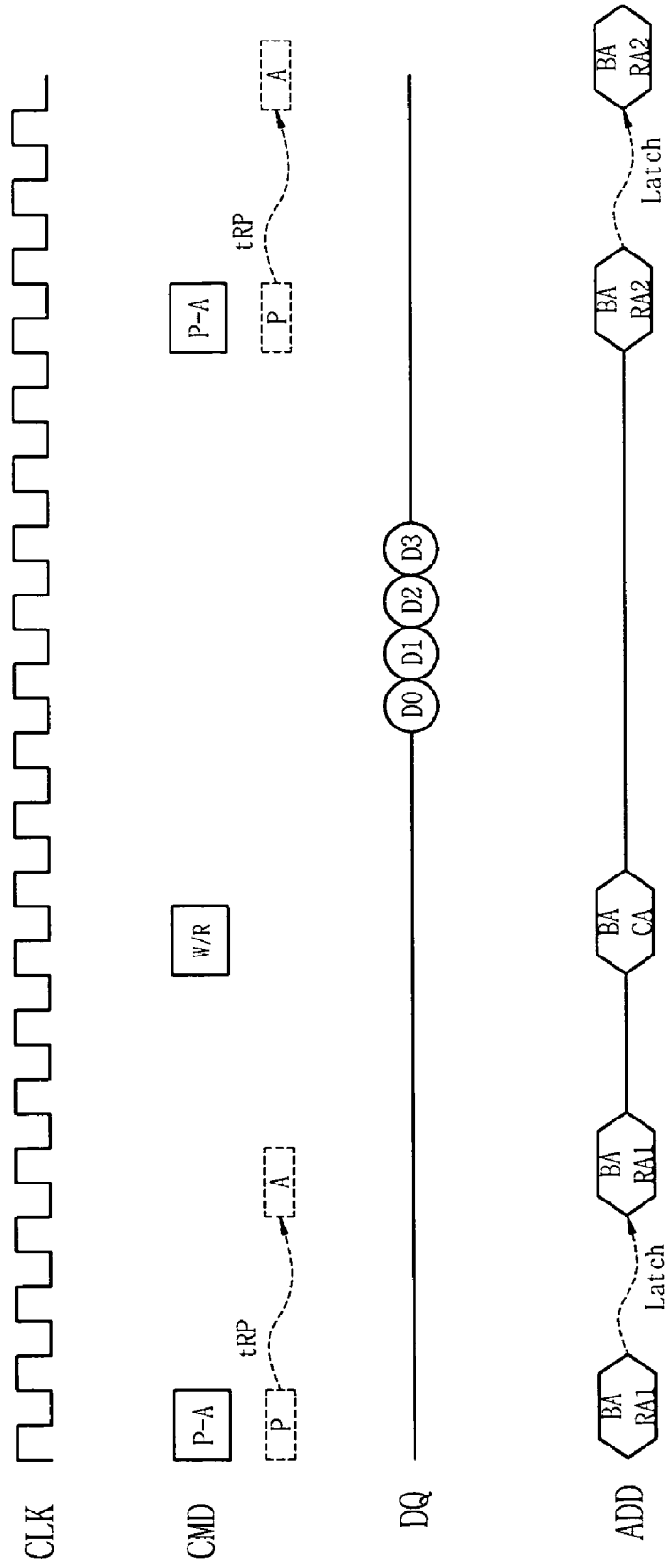

Operation of the semiconductor memory device according to example embodiments is described with reference to FIGS. 6 and 7 as follows. FIG. 6 illustrates timing of the general operation of the semiconductor memory device illustrated in FIG. 4.

Referring to FIG. 6, the pre-active command P-A may be applied to the operation controller 450. Simultaneously, corresponding bank address BA and row address RA signals may be applied to the address controller 440. The precharge control unit 420 of the semiconductor memory device 400 may then perform a precharge operation of the bank corresponding to the applied bank address BA. Active operation through the active control unit 430 may be implemented automatically after a given delay or in response to the operation start signal A provided from the delay control unit 410. The bank address BA and the row address RA signals may be latched and delayed, and may be applied to the active control unit 430 as active addresses ACT_BA and ACT_RA, respectively.

A read or write operation may be performed by the read or write command W/R. When a new pre-active command P-A is applied after a lapse of given time, the precharge operation and the active operation corresponding to address signals BA and RA applied simultaneously thereto may be implemented.

A semiconductor memory device typically may include an address buffer for an address input. In the conventional art, the address buffer must remain in an on-state status from the time of a precharge operation to the start of an active operation. As such, it may not be possible to predict at which time the address signal will be applied. However, in example embodiments, an address signal may be input previously and latched in the precharge operation and thus, the address buffer may not need to remain in an on-state status. This may become a factor for reducing current consumption.

Figure 7:
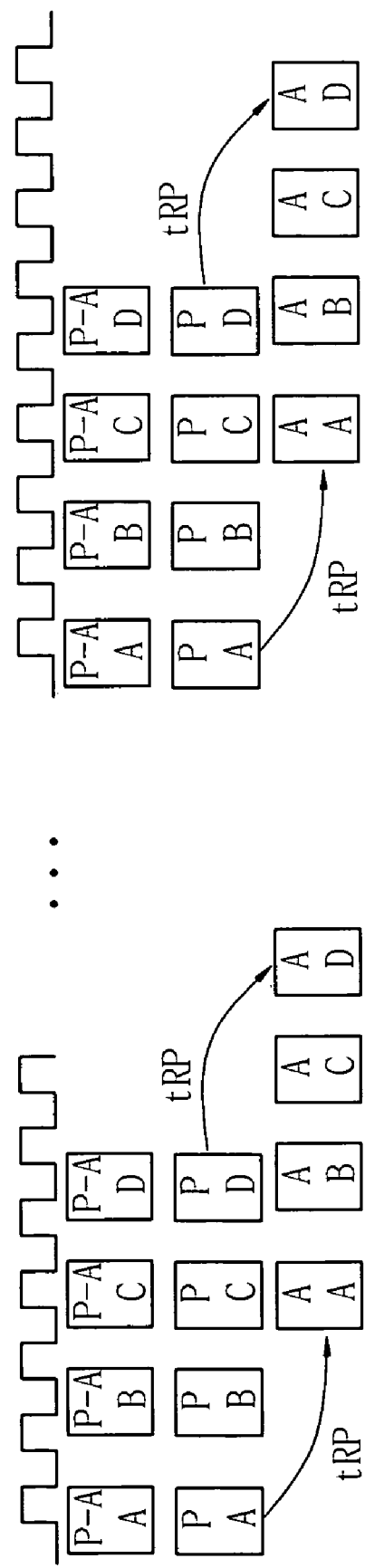

FIG. 7 illustrates timing of a bank interleave operation of the semiconductor memory device illustrated in FIG. 4.

Figure 3:
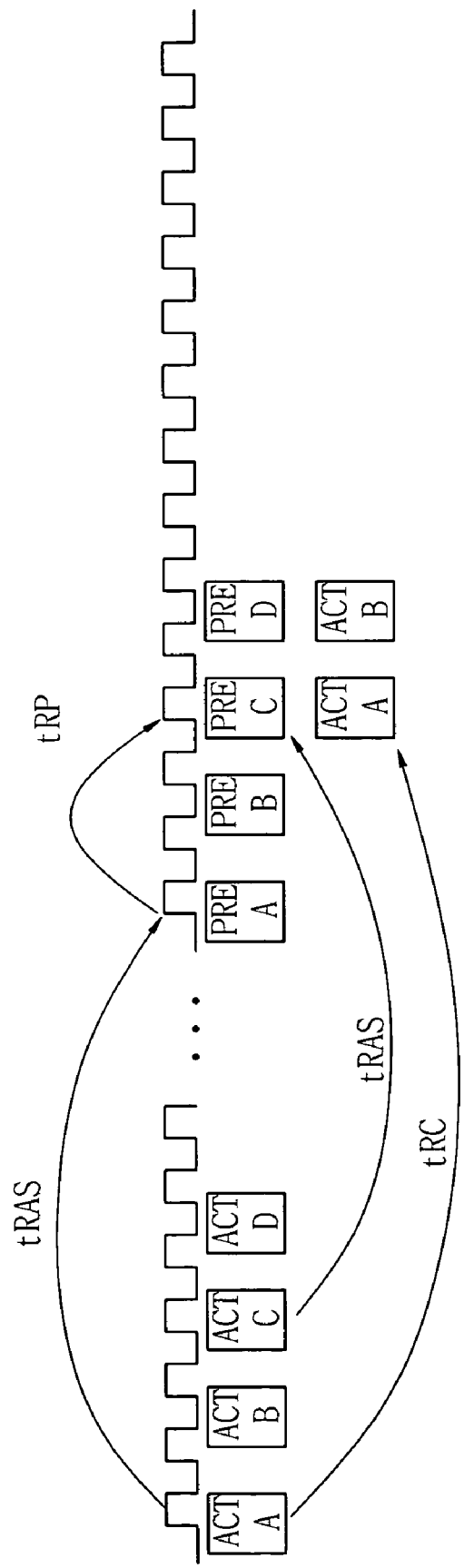

In comparison with FIG. 3, FIG. 7 provides a precharge operation with the reference character 'P' and an active operation with the reference character 'A' to distinguish from the conventional precharge command PRE and the conventional active command ACT.

Referring to FIG. 7, pre-active commands P-AA, P-AB, P-AC, and P-AD for banks A, B, C, and D, respectively, may be sequentially applied. The semiconductor memory device may then start to perform a precharge operation for the respective banks. After the precharge operation PA for bank A and the lapse of a given delay tRP, an active operation AA for bank A may begin. Active operation AB for bank B after precharge operation PB for bank B and the lapse of given delay tRP, active operation AC for bank C after precharge operation PC for bank C and the lapse of given delay tRP, and active operation AD for bank D after precharge operation PD for bank D and the lapse of given delay tRP may be performed sequentially.

Referring to FIG. 7, operation of the pre-active signal P-AC corresponding to bank C may be applied. At the time when the pre-active signal P-AC corresponding to bank C is applied, the precharge operation PC for bank C may be performed and bank A may implement active operation AA. In other words, an active or precharge operation for several banks may be performed at the same clock cycle. A minimum tRC (ROW CYCLE TIME) condition, which is almost impossible in the conventional art, may be guaranteed herein along with the enhancement of system performance.

As described above, according to example embodiments, an active operation and a precharge operation may be performed by one command, thereby simplifying the scheme of command such that loading of the chip set may be reduced. Also, an active or precharge operation for mutually different banks at the same clock cycle may be implemented, thereby enhancing system performance and reducing current consumption.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A method of controlling operation of a semiconductor memory device, comprising:

executing a control such that a precharge operating mode and an active operating mode are successively performed in response to one pre-active command, wherein a bank address signal for the precharge operating mode and the active operating mode and a row address signal for the active operating mode are applied simultaneously to an applied pre-active command, and the bank address signal and the row address signal are latched until the active operating mode starts.

2. The method of claim 1, wherein the active operating mode automatically starts after the start of the precharge operating mode and after a given delay.

3. The method of claim 1, wherein the pre-active command is applied from an external chip set.

4. The method of claim 1, wherein the pre-active command is selected by an extended mode register set (EMRS).

5. The method of claim 2, wherein a level of delay from the start of the precharge operating mode to the start of the active operating mode is controllable.

6. The method of claim 1, wherein the semiconductor memory device performs a precharge operation and an active operation by the pre-active command in a specific mode, and performs the precharge operation and the active operation by a specific precharge command and a specific active command in a normal mode.

7. A semiconductor memory device comprising:

an operation controller for performing a precharge operation and an active operation successively in response to one pre-active command, wherein the semiconductor memory device performs the precharge operation and the active operation by the pre-active command in a specific mode, and performs the prechare operation and the active operation by a specific precharge command and a specific active command in a normal mode.

8. The method of claim 7, wherein the pre-active command is applied from an external chip set.

9. The device of claim 8, further comprising:

an address controller for controlling address signals provided from the external chip set such that the precharge operation and the active operation of the operation controller are obtained.

10. The device of claim 7, wherein the active operation automatically starts after the start of the precharge operation and after a given delay.

11. The device of claim 9, wherein each address signal contains a bank address signal and a row address signal and are applied simultaneously to the pre-active command.

12. The device of claim 11, wherein the address controller comprises an address latch for latching the bank address signal and the row address signal until the active operation starts.

13. The device of claim 10, wherein the operation controller comprises a delay control unit for controlling a level of delay from the start of the precharge operation to the start of the active operation.

14. The device of claim 7, wherein the pre-active command is selected by an EMRS.

15. A method of controlling operation of a semiconductor memory device, comprising:

executing a control such that a precharge operating mode and an active operating mode are successively performed in response to one pre-active command, wherein the semiconductor memory device performs a precharge operation and an active operation by the pre-active command in a specific mode, and performs the precharge operation and the active operation by a specific precharge command and a specific active command in a normal mode.

* * * * *